United States Patent
Kim et al.

(10) Patent No.: US 9,871,224 B2
(45) Date of Patent: Jan. 16, 2018

(54) ENCAPSULATION FILM

(71) Applicant: LG CHEM, LTD., Seoul (KR)

(72) Inventors: Hyun Suk Kim, Daejeon (KR); Hyun Jee Yoo, Daejeon (KR); Jung Ok Moon, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/305,319

(22) PCT Filed: Feb. 17, 2016

(86) PCT No.: PCT/KR2016/001603
§ 371 (c)(1),
(2) Date: Oct. 19, 2016

(87) PCT Pub. No.: WO2016/133361
PCT Pub. Date: Aug. 25, 2016

(65) Prior Publication Data
US 2017/0040570 A1    Feb. 9, 2017

(30) Foreign Application Priority Data

Feb. 17, 2015    (KR) ........................ 10-2015-0024423

(51) Int. Cl.
*H01L 51/52* (2006.01)
*H01L 51/44* (2006.01)
*H01L 51/00* (2006.01)
*H01L 51/56* (2006.01)

(52) U.S. Cl.
CPC ...... *H01L 51/5253* (2013.01); *H01L 51/0097* (2013.01); *H01L 51/44* (2013.01); *H01L 51/5259* (2013.01); *H01L 51/56* (2013.01); *H01L 2251/301* (2013.01); *H01L 2251/55* (2013.01); *H01L 2251/558* (2013.01); *Y02E 10/549* (2013.01); *Y02P 70/521* (2015.11)

(58) Field of Classification Search
CPC .................................................. Y01E 10/549
See application file for complete search history.

(56) References Cited

U.S. PATENT DOCUMENTS

| 2003/0213956 A1* | 11/2003 | Hioki ................ G02F 1/133305 257/59 |
| 2004/0232459 A1 | 11/2004 | Takayama et al. |
| 2009/0067151 A1* | 3/2009 | Sahlin ................. G02B 6/0035 362/23.03 |

(Continued)

FOREIGN PATENT DOCUMENTS

| CN | 101546655 A | 9/2009 |
| CN | 103998238 A | 8/2014 |

(Continued)

*Primary Examiner* — Lex Malsawma
(74) *Attorney, Agent, or Firm* — Dentons US LLP

(57) ABSTRACT

Provided are an encapsulation film, an organic electronic device including the same, and a method of manufacturing the organic electronic device. Particularly, the encapsulation film, which effectively blocks moisture or oxygen entering the organic electronic device from the outside, and has excellent mechanical properties such as handleability and processability, and the organic electronic device including the same are provided.

12 Claims, 1 Drawing Sheet

(56) References Cited

U.S. PATENT DOCUMENTS

| | | | | |
|---|---|---|---|---|
| 2010/0151274 A1* | 6/2010 | Kang | ............... | B05D 3/065 |
| | | | | 428/688 |
| 2012/0132932 A1 | 5/2012 | Ha | | |
| 2014/0064682 A1* | 3/2014 | Debban | ............ | G02B 6/4483 |
| | | | | 385/102 |
| 2014/0167006 A1* | 6/2014 | Kim | ............ | H01L 27/3244 |
| | | | | 257/40 |
| 2014/0231776 A1* | 8/2014 | Takahashi | ......... | B29C 59/022 |
| | | | | 257/40 |
| 2014/0306213 A1* | 10/2014 | Sato | ........... | H01L 51/5275 |
| | | | | 257/40 |

FOREIGN PATENT DOCUMENTS

| | | |
|---|---|---|
| CN | 104054191 A | 9/2014 |
| JP | 2005-310803 A | 11/2005 |
| JP | 2011-222334 A | 11/2011 |
| JP | 2012-227516 A | 11/2012 |
| JP | 2013-241542 A | 12/2013 |
| JP | 2014-5324 A | 1/2014 |
| KR | 10-2012-0055720 A | 5/2012 |
| KR | 10-2013-0135142 A | 12/2013 |
| KR | 10-2014-0136902 A | 12/2014 |
| TW | 201033327 A | 9/2010 |
| TW | 201402740 A | 1/2014 |
| WO | 2012151744 A1 | 11/2012 |

\* cited by examiner

ENCAPSULATION FILM

CROSS-REFERENCE TO RELATED APPLICATION

This application is a National Stage Application of International Application No. PCT/KR2016/001603 filed on Feb. 17, 2016, which claims the benefit of Korean Patent Application No. 10-2015-0024423 filed on Feb. 17, 2015, all of which are hereby incorporated by reference in their entirety for all purposes as if fully set forth herein.

BACKGROUND

1. Field of the Invention

The present application relates to an encapsulation film, an organic electronic device (OED) including the same, and a method of manufacturing an OED using the same.

2. Discussion of Related Art

An OED is a device including an organic material layer in which electric charges are exchanged using holes and electrons, and the OED may be, for example, a photovoltaic device, a rectifier, a transmitter, or an organic light emitting diode (OLED).

Among the OEDs, an OLED has lower power consumption and a higher response speed, and is more advantageous in reducing the thickness of a display device or lighting than a conventional light source. Such an OLED also has excellent space utilization, and is expected to be applied to various fields including all types of portable devices, monitors, notebook computers and TVs.

For commercialization and expanded use of the OLED, the most critical problem is durability. Organic materials and metal electrodes included in the OLED are very easily oxidized by an external factor, for example, moisture. Therefore, a product including an OLED is very sensitive to environmental factors. For this reason, various methods have been suggested to effectively prevent the permeation of oxygen or moisture into an OED such as an OLED from the outside.

SUMMARY OF THE INVENTION

The present application provides an encapsulation film, which can form a structure capable of effectively blocking moisture or oxygen entering an organic electronic device (OED) from the outside, and has excellent mechanical properties such as a handleability and processability.

The present application relates to an encapsulation film. The encapsulation film may be applied to encapsulate or capsulate an OED such as the OLED.

The term "organic electronic device" used herein refers to a product or device having a structure including an organic material layer in which electric charges are exchanged using holes and electrons between a pair of facing electrodes, and examples of the OED may include, but the present application is not limited to, a photovoltaic device, a rectifier, a transmitter, and an OLED. In an exemplary embodiment of the present application, the OED may be an OLED.

The exemplary encapsulation film 10 may include, as shown in FIG. 1, a protective layer 13, a metal layer 12 and an encapsulation layer 11, which are sequentially formed. Here, the protective layer may have a tensile modulus of 0.01 to 500 MPa at 25° C. The encapsulation layer may contain a pressure-sensitive adhesive composition or an adhesive composition. The present application relates to an encapsulation film provided by integrating the protective layer, the metal layer and the encapsulation layer as described above. However, when the film is provided as described above, the warpage of a panel may occur in a high temperature process resulting in an alignment error in each layer. In the present application, the warpage of the panel occurring because of the characteristics of a film for encapsulating an organic electronic element undergoing a high temperature process may be prevented, and an alignment error of the encapsulation film in which all components are integrated may be minimized by controlling the range of a tensile modulus of the protective layer.

In one exemplary embodiment, the protective layer and the metal layer of the present application may satisfy General Equation 1.

$$T_p/T_m \geq 1 \quad \text{[General Equation 1]}$$

In General Equation 1, $T_p$ is a thickness of the protective layer, and $T_m$ is a thickness of the metal layer. A ratio of the thickness of the protective layer to the thickness of the metal layer ($T_p/T_m$) may be 1 or more, 1.3 or more, 1.5 or more, 1.8 or more, 2 or more, or 2.1 or more. The thickness of the protective layer may be in a range of 40 to 400 μm, 50 to 380 μm, 55 to 350 μm, 60 to 330 μm, 70 to 300 μm, or 80 to 280 μm. Also, the thickness of the metal layer may be in a range of 10 to 100 μm, 11 to 90 μm, 12 to 80 μm, 13 to 70 μm, 14 to 60 μm, 15 to 50 μm, or 16 to 45 μm. In the present application, damage to the organic electronic element caused by an external impact in a process of manufacturing an OED may be prevented by controlling the thickness of the protective layer to be the above-mentioned value or higher. Also, the present application may provide an OED having flexibility by controlling the thickness of the metal layer to be the above value or less. Accordingly, to provide the encapsulation film, which has flexibility to be applied to a flexible display such as an OED and is capable of preventing damage, for example, a dent caused by an external impact during the process of manufacturing an OED, the thickness of the metal layer and the thickness of the protective layer may satisfy the thickness ratio of General Equation 1. Meanwhile, when the thickness of the protective layer is increased in a predetermined range or more, the damage generated in the process may be prevented, but the OED may have warpage at high temperature. Therefore, the thickness of the protective layer may be 400 μm or less. Also, as the protective layer of the encapsulation film satisfies the above range of the tensile modulus, the present application may provide an encapsulation film for an OED, which can prevent damage to the element and the warpage of a panel, minimize the alignment error of the OED, and be applied to a flexible display.

In an exemplary embodiment of the present application, the metal layer of the encapsulation film may be transparent or opaque. Meanwhile, the term "metal layer" used herein may be used to mean the same as an inorganic layer. The metal layer may be formed by depositing a metal on a thin metal foil or a polymer base film. The polymer base layer may be the above-described protective layer. For the metal layer, any material having thermal conductivity and a moisture blocking property may be used without limitation. The metal layer may include any one of a metal, a metal oxide, a metal nitride, a metal carbide, a metal oxynitride, a metal oxyboride, and mixtures thereof. For example, the metal layer may include an alloy in which one or more metal elements or non-metal elements are added to one metal, for example, the alloy may be an iron-nickel alloy or stainless steel (SUS). Also, in an exemplary embodiment, the metal layer may include copper, nickel, aluminum, silicon oxide, aluminum oxide, titanium oxide, indium oxide, tin oxide, indium tin oxide, tantalum oxide, zirconium oxide, niobium oxide or mixtures thereof. The metal layer may be deposited using a means for electrolysis, rolling, heated evaporation, electron beam evaporation, sputtering, reactive sputtering, chemical vapor deposition, plasma chemical vapor deposition or electron cyclotron resonance plasma source chemical vapor deposition. In one exemplary embodiment of the present application, the metal layer may be deposited by reactive sputtering.

Preferably, the metal layer may have a thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. Due to the high thermal conductivity, heat generated at a laminating interface in a process of laminating the metal layer may be more rapidly emitted. Also, because of the high thermal conductivity, heat accumulated in the operation of the OED may be quickly emitted to the outside, and thus a temperature of the OED itself may be maintained lower, and cracks and defects may be reduced.

The term "thermal conductivity" used herein may be a degree of the ability to transfer heat by conduction, and a unit may be W/mK. The unit is a degree of heat transmission of a material at the same temperature and distance, and refers to a unit (watt) of heat with respect to a unit (meter) of a distance and a unit (kelvin) of a temperature.

Also, the metal layer may have a tensile modulus of 10,000 to 250,000 MPa, 20,000 to 240,000 MPa, or 30,000 to 230,000 MPa at 25° C. As the tensile modulus of the metal layer is controlled in the above range, the present application can provide an encapsulation film for an OED, which can prevent the warpage of a panel, minimize an alignment error, and be applied to a flexible display.

As described above, the encapsulation film may include a protective layer. The protective layer may prevent corrosion when the metal layer is in contact with moisture, and damage caused by folding or bending in the process.

Also, as described above, the protective layer may have a tensile modulus of 0.01 to 500 MPa at 25° C. Measurement of the tensile modulus may be performed by a method known in the art. For example, a specimen is prepared by coating a protective layer to a thickness of 80 μm and cutting the protective layer into a size of 50 mm×10 mm (length× width) in a lengthwise direction, which is the coating direction during the manufacture of the protective layer, and then both ends of the specimen are taped in the lengthwise direction until only 25 mm of the specimen remains. Subsequently, a tensile modulus is measured by stretching the specimen by grabbing the taped parts at 1 mm/min, and 25° C. In one exemplary embodiment, the tensile modulus of the protective layer may be in a range of 0.01 to 500 MPa, 0.1 to 450 MPa, 0.5 to 400 MPa, or 1 to 350 MPa at 25° C. The protective layer of the present application may have a coefficient of linear expansion of 60 ppm/K or more or 100 ppm/K or more, and 500 ppm/K or less. The protective layer has the low tensile modulus as described above even though having a high coefficient of linear expansion. Therefore, when the encapsulation film is applied to an OED, even though the encapsulation film is contracted or expanded at high temperature, step differences between layers constituting the encapsulation film may be minimized and the warpage of a panel may be prevented.

In one exemplary embodiment, the protective layer may contain a resin component. A material constituting the protective layer is not particularly limited as long as it satisfies the above range of the tensile modulus. In one exemplary embodiment, the resin component constituting the protective layer may be, but is not limited to, one or more selected from the group consisting of polyorganosiloxane, a polyimide, a styrene-based resin or elastomer thereof, a polyolefin-based resin or elastomer thereof, a polyoxyalkylene-based resin or elastomer thereof, a polyester-based resin or elastomer thereof, a polyvinylchloride-based resin or elastomer thereof, a polycarbonate-based resin or elastomer thereof, a polyphenylenesulfide-based resin or elastomer thereof, a polyamide-based resin or elastomer thereof, an acrylate-based resin or elastomer thereof, an epoxy-based resin or elastomer thereof, a silicone-based resin or elastomer thereof, and a fluorine-based resin or elastomer thereof. The resin component may have a glass transition temperature of less than 0° C., less than −10° C., less than −30° C., less than −50° C., or less than −60° C. Here, the glass transition temperature may be a glass transition temperature after UV rays are applied at a dose of about 1 $J/cm^2$ or more; or a glass transition temperature after UV irradiation and additional heat-curing.

Also, the protective layer may further contain a magnetic substance. When the magnetic substance is contained in the protective layer, a process for the integrated encapsulation film by magnetic force becomes possible, and thus convenience of the process is ensured and productivity is improved. In one exemplary embodiment, the magnetic substance may be one or more selected from the group consisting of $Fe_3O_4$, $Fe_2O_3$, $MnFe_2O_4$, $BaFe_{12}O_{19}$, $SrFe_{12}O_{19}$, $CoFe_2O_4$, Fe, CoPt, and FePt. The magnetic substance may constitute the protective layer together with the resin component of the protective layer in the form of powder. Also, in an exemplary embodiment of the present application, the magnetic substance may be included at 20 to 400 parts by weight, 50 to 400 parts by weight, 60 to 350 parts by weight, 70 to 300 parts by weight, or 80 to 250 parts by weight with respect to 100 parts by weight of the resin component. As the magnetic substance is contained at the above value or more, the film may be fixed by magnets with a sufficient magnetic force. Therefore, an additional process is not required to fix the film, and thus the productivity is improved.

Also, the thermal conductivity of the protective layer may be 0.5 W/mK or more, 0.7 W/mK or more, 1 W/mK or more, 5 W/mK or more, 10 W/mK or more, or 20 W/mK or more, and the upper limit may be, but is not particularly limited to, 500 W/mK or less. In one exemplary embodiment, the protective layer may include a thermally conductive filler. The thermally conductive filler may be a material known in the art, which may include, for example, one or more selected from the group consisting of aluminum oxide, magnesium oxide, calcium oxide, calcium carboxide, boron nitride, aluminum nitride, silicon carbide and aluminum hydroxide. The thermally conductive filler may be included at 200 to 1500 parts by weight, 300 to 1400 parts by weight, 400 to 1300 parts by weight, or 450 to 1200 parts by weight with respect to 100 parts by weight of the resin component constituting the protective layer.

In one exemplary embodiment, the encapsulation film may include an encapsulation layer. In one exemplary embodiment, the encapsulation layer may have a single layer or a multilayer structure having two or more layers. When the encapsulation layer is composed of two or more layers, a composition of each layer of the encapsulation layer may be the same as or different from each other. In one exemplary embodiment, the encapsulation layer may be a pressure-sensitive adhesive layer containing a pressure-sensitive adhesive composition. Also, the encapsulation layer may be an adhesive layer containing an adhesive composition.

In an exemplary embodiment of the present application, the encapsulation layer may contain an encapsulation resin. The encapsulation resin may have a glass transition temperature of less than 0° C., less than −10° C., less than −30° C., less than −50° C., or less than −60° C. Here, the glass transition temperature may be a glass transition temperature after UV rays are applied at a dose of about 1 J/cm² or more; a glass transition temperature after UV irradiation and additional heat-curing.

In one exemplary embodiment, the encapsulation resin may be a styrene-based resin or elastomer thereof, a polyolefin-based resin or elastomer thereof, other elastomers, a polyoxyalkylene-based resin or elastomer thereof, a polyester-based resin or elastomer thereof, a polyvinylchloride-based resin or elastomer thereof, a polycarbonate-based resin or elastomer thereof, a polyphenylenesulfide-based resin or elastomer thereof, a mixture of hydrocarbons, a polyamide-based resin or elastomer thereof, an acrylate-based resin or elastomer thereof, an epoxy-based resin or elastomer thereof, a silicone-based resin or elastomer thereof, a fluorine-based resin or elastomer thereof, or mixtures thereof.

Here, the styrene-based resin or elastomer thereof may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or mixtures thereof. The olefin-based resin or elastomer may be, for example, a high-density polyethylene-based resin or elastomer, a low-density polyethylene-based resin or elastomer, a polypropylene-based resin or elastomer, or mixtures thereof. The elastomer may be, for example, an ester-based thermoplastic elastomer, an olefin-based elastomer, a silicone-based elastomer, an acryl-based elastomer, or mixtures thereof. Among these, the olefin-based thermoplastic elastomer may be a polybutadiene resin or elastomer or a polyisobutylene resin or elastomer. The polyoxyalkylene-based resin or elastomer may be, for example, a polyoxymethylene-based resin or elastomer, a polyoxyethylene-based resin or elastomer, or mixtures thereof. The polyester-based resin or elastomer may be, for example, a polyethylene terephthalate-based resin or elastomer, a polybutylene terephthalate-based resin or elastomer, or mixtures thereof. The polyvinylchloride-based resin or elastomer may be, for example, polyvinylidene chloride. The mixture of hydrocarbons may be, for example, hexatriacotane or paraffin. The polyamide-based resin or elastomer may be, for example, nylon. The acrylate-based resin or elastomer may be, for example, polybutyl (meth)acrylate. The epoxy-based resin or elastomer may be, for example, a bisphenol-type such as a bisphenol A-type, a bisphenol F-type, a bisphenol S-type, and a hydrogenated product thereof; a novolac-type such as a phenol novolac-type or a cresol novolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as a dicyclopentadiene-type; an ester-type; an etherester-type; or mixtures thereof. The silicone-based resin or elastomer may be, for example, polydimethylsiloxane. In addition, the fluorine-based resin or elastomer may be a polytrifluoroethylene resin or elastomer, a polytetrafluoroethylene resin or elastomer, a polychlorotrifluoroethylene resin or elastomer, a polyhexafluoropropylene resin or elastomer, polyvinylidene fluoride, polyvinyl fluoride, polyethylenepropylene fluoride, or mixtures thereof.

A listed resin or elastomer may be grafted with maleic anhydride, copolymerized with another listed resin or elastomer or a monomer to prepare a resin or elastomer, or modified by another compound. The compound may be a carboxyl-terminated butadiene-acrylonitrile copolymer.

In one exemplary embodiment, the encapsulation layer may include an olefin-based elastomer, a silicone-based elastomer or an acryl-based elastomer of the above-described types as the encapsulation resin, but the present application is not limited thereto.

In an exemplary embodiment of the present application, the encapsulation resin may be an olefin-based resin. In one exemplary embodiment, the olefin-based resin may be a copolymer of diene and an olefin-based compound including a carbon-carbon double bond. Here, the olefin-based compound may include isobutylene, propylene or ethylene, and the diene may be a monomer which can be polymerized with the olefin-based compound and include, for example, 1-butene, 2-butene, isoprene or butadiene. That is, as the encapsulation resin of the present application, for example, a homopolymer of an isobutylene monomer, a copolymer prepared by copolymerizing an isobutylene monomer and another monomer capable of being polymerized therewith, or mixtures thereof may be used. In one exemplary embodiment, the copolymer of the olefin-based compound including one carbon-carbon double bond and diene may be butyl rubber. As a specific resin is used as described above, a moisture blocking property to be realized in the present application may be satisfied. Also, the conventional isobutylene polymer has a low moisture transmission rate and low thermal resistance, and in the present invention, a specific crosslinked structure may be realized in the encapsulation layer to improve moisture resistance and thermal resistance.

In the encapsulation layer, the resin or elastomer component may have a weight average molecular weight (Mw) for the pressure-sensitive adhesive composition to be molded in a film shape. For example, the resin or elastomer may have a weight average molecular weight of about 100,000 to 2,000,000, 100,000 to 1,500,000, or 100,000 to 1,000,000. The term "weight average molecular weight" used herein refers to a conversion value for standard polystyrene measured by gel permeation chromatography (GPC). However, the resin or elastomer component does not necessarily need the above-described weight average molecular weight. For example, when the molecular weight of the resin or elastomer is not enough to form a film, a separate binder resin may be mixed in the pressure-sensitive adhesive composition.

In another exemplary embodiment, the encapsulation resin according to the present application may be a curable resin. A specific type of the curable resin that can be used in the present application is not particularly limited, and various heat-curable or photocurable resins known in the art may be used. The term "heat-curable resin" refers to a resin that can be cured by a suitable heat application or aging process, and the term "photocurable resin" refers to a resin that can be cured by irradiation with electromagnetic waves. Also, the curable resin may be a dual curable resin including both of heat-curable and photocurable characteristics.

In the present application, a specific type of the curable resin is not particularly limited, and one having the above-described characteristics may be used. For example, the curable resin may have an adhesive property after being cured, and may be a resin including one or more heat-curable functional groups, for example, a glycidyl group, an isocyanine group, a hydroxyl group, an isocyanine group, a hydroxyl group, a carboxyl group or an amide group, or a resin including one or more functional groups that can be cured by irradiation with electromagnetic waves, for example, an epoxide group, a cyclic ether group, a sulfide group, an acetal group or a lactone group. Also, a specific type of the above-described resin may be an acryl resin, a polyester resin, an isocyanine resin or an epoxy resin, but the present application is not limited thereto.

In the present application, as the curable resin, an aromatic or aliphatic, or linear or branched epoxy resin may be used. In one exemplary embodiment of the present application, as an epoxy resin having at least two functional groups, an epoxy equivalent weight of 180 to 1,000 g/eq may be used. Characteristics such as adhesive performance and a glass transition temperature of a cured product may be effectively maintained by using the epoxy resin having the above range of the epoxy equivalent weight. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin, and a dicyclopentadiene-modified phenol-type epoxy resin.

In the present application, as a curable resin, an epoxy resin having a cyclic structure in a molecular structure may be used, and an epoxy resin including an aromatic group (for example, a phenyl group) may be used. When the epoxy resin includes an aromatic group, a cured product may have excellent thermal and chemical stabilities and low moisture absorbance, thereby enhancing the reliability of an encapsulation structure of the OED. A specific example of the epoxy resin containing an aromatic group that can be used in the present application may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin, and an alkyl-modified triphenolmethane epoxy resin.

In the present application, also, as the epoxy resin, a silane-modified epoxy resin, and, a silane-modified epoxy resin having an aromatic group may be used. When such an epoxy resin that is modified with a silane and thus structurally has a silane group is used, adhesion of the OED to a glass substrate or a substrate inorganic material is maximized, and a water barrier property or durability and reliability may be enhanced. Such a specific type of the epoxy resin that can be used in the present application is not particularly limited, and the resin may be easily obtained from a manufacturer, for example, Kukdo Chemical, Co., Ltd.

Also, the encapsulation layer of the present application may include an active energy ray polymerizable compound which has a high compatibility with an encapsulation resin, and may form a specific crosslinked structure with the encapsulation resin.

For example, the encapsulation layer of the present application may include a multifunctional active energy ray polymerizable compound capable of being polymerized with the encapsulation region by irradiation with an active energy ray. The active energy ray polymerizable compound may refer to a compound including two or more functional groups capable of participating in a polymerization reaction by irradiation with an active energy ray, for example, functional groups including an ethylene-like unsaturated double bond such as an acryloyl or methacryloyl group, and functional groups such as an epoxy or oxetane group.

As a multifunctional active energy ray polymerizable compound, for example, a multifunctional acrylate (MFA) may be used.

Also, the multifunctional active energy ray polymerizable compound capable of being polymerized by the irradiation with the active energy ray may satisfy Formula 1. Also, the active energy ray polymerizable compound may be included at 5 to 30 parts by weight, 5 to 25 parts by weight, 8 to 20 parts by weight, 10 to 18 parts by weight, or 12 to 18 parts by weight with respect to 100 parts by weight of the encapsulation resin.

[Formula 1]

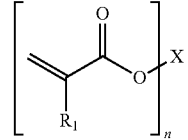

In Formula 1, $R_1$ is hydrogen or an alkyl group having 1 to 4 carbon atoms, n is an integer of 2 or higher, and X is a residue derived from a linear, branched or cyclic alkyl group having 3 to 30 carbon atoms. Here, when X is a residue derived from a cyclic alkyl group, X may be a residue derived from a cyclic alkyl group having 3 to 30, 6 to 28, 8 to 22, or 12 to 20 carbon atoms. Also, when X is a residue derived from a linear alkyl group, X may be a residue derived from a linear alkyl group having 3 to 30, 6 to 25, or 8 to 20 carbon atoms. Also, when X is a residue derived from a branched alkyl group, X may be a residue derived from a branched alkyl group having 3 to 30, 5 to 25, or 6 to 20 carbon atoms.

The term "residue derived from an alkyl group" used herein may refer to a residue of a specific compound, for example, an alkyl group. In an exemplary embodiment, in Formula 1, when n is 2, X may be an alkylene group. Also, when n is 3 or higher, two or more hydrogen atoms are released from an alkyl group of X, and may be bound to a (meth)acryloyl group of Formula 1.

The term "alkyl group" used herein may be, unless particularly defined otherwise, an alkyl group having 1 to 30, 1 to 25, 1 to 20, 1 to 16, 1 to 12, 1 to 8, or 1 to 4 carbon atoms. The alkyl group may have a linear, branched or cyclic structure, and may be arbitrarily substituted with at least one substituent.

Also, the term "alkylene group" or "alkylidene group" used herein may be, unless particularly defined otherwise, an alkylene or alkylidene group having 2 to 30, 2 to 25, 2 to 20, 2 to 16, 2 to 12, 2 to 10, or 2 to 8 carbon atoms. The alkylene group or an alkylidene group may be linear, branched or cyclic. Also, the alkylene or alkylidene group may be arbitrarily substituted with at least one substituent.

The term "alkoxy group" used herein may be, unless particularly defined otherwise, an alkoxy group having 1 to 20, 1 to 16, 1 to 12, 1 to 8, or 1 to 4 carbon atoms. The alkyl group may have a linear, branched or cyclic structure. Also, the alkoxy group may be arbitrarily substituted with at least one substituent.

The multifunctional active energy ray polymerizable compound capable of being polymerized by the irradiation with an active energy ray may be used without limitation as long as Formula 1 is satisfied. For example, the compound may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth) acrylate, neophentyl glycol di(meth) acrylate, dicyclopentanyl di(meth)acrylate, cyclohexane-1,4-dimethanol di(meth) acrylate, tricyclodec anedimethanol (meth)diacrylate, dimethylol dicyclopentane di(meth)acrylate, neopentyl glycol modified trimethylpropane di(meth)acrylate, adamantane di(meth)acrylate, trimethylolpropane tri(meth)acrylate, or mixtures thereof.

As the multifunctional active energy ray polymerizable compound, for example, a compound having a molecular weight of less than 1,000 and including two or more functional groups may be used. In this case, the molecular weight may refer to a weight average molecular weight or a conventional molecular weight. A ring structure included in the multifunctional active energy ray polymerizable compound may be any one of a carbocyclic structure, a heterocyclic structure, a monocyclic structure or a polycyclic structure.

In an exemplary embodiment of the present application, the encapsulation layer may further include a radical initiator. The radical initiator may be a photoinitiator or a thermal initiator. A specific type of the photoinitiator may be suitably selected by considering a curing rate and yellowing probability. For example, a benzoin-based, hydroxyketone-based, aminoketone-based or phosphine oxide-based photoinitiator may be used, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-amino anthraquinone, 2-methylxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo [2-hydroxy-2-methyl-1-[4-(1-methylvinyl) phenyl]propanone] or 2,4,6-trimethylbenzoyl-diphenyl-phosphineoxide may be used.

The radical initiator may be included at 0.2 to 20 parts by weight, 0.5 to 18 parts by weight, 1 to 15 parts by weight, or 2 to 13 parts by weight with respect to 100 parts by weight of the active energy ray polymerizable compound. Therefore, a reaction of the active energy ray polymerizable compound may be effectively induced, and degradation of the physical properties of the encapsulation layer due to a residual component after curing may be prevented.

In one exemplary embodiment, the encapsulation layer may further include a heat-curable compound. The heat-curable compound may include the above-described multifunctional acrylate. Such a multifunctional acrylate may be crosslinked by the above-described thermal radical initiator or curing agent.

In an exemplary embodiment of the present application, the encapsulation layer of the encapsulation film may further include a curing agent according to the type of the encapsulation resin. For example, a curing agent capable of forming a crosslinking structure by a reaction with the above-described encapsulation resin may be further included.

A suitable type of the curing agent may be selected and used according to the type of the encapsulation resin or functional group included in the resin.

In one exemplary embodiment, when the encapsulation resin is an epoxy resin, as a curing agent for an epoxy resin known in the art, for example, one or two or more of an amine curing agent, an imidazole curing agent, a phenol curing agent, a phosphorus curing agent, and an acid anhydride curing agent may be used, but the present application is not limited thereto.

In one exemplary embodiment, the curing agent may be an imidazole compound, which has a solid phase at high temperature and has a melting point or decomposition temperature of 80° C. or more, may be used. Such a compound may be, for example, 2-methyl imidazole, 2-heptadecyl imidazole, 2-phenyl imidazole, 2-phenyl-4-methyl imidazole or 1-cyanoethyl-2-phenyl imidazole, but the present application is not limited thereto.

A content of the curing agent may be selected according to a composition of the composition, for example, the type or ratio of the encapsulation resin. For example, the curing agent may be included at 1 to 20 parts by weight, 1 to 10 parts by weight, or 1 to 5 parts by weight with respect to 100 parts by weight of the encapsulation resin. However, the weight ratio may be changed by the type and ratio of the encapsulation resin or functional group thereof, or a crosslinking density to be realized.

When the encapsulation resin may be a resin that can be cured by the irradiation with an active energy ray, as an initiator, for example, a cationic photopolymerization initiator may be used.

As the cationic photopolymerization initiator, an onium salt- or organometallic salt-based ionized cationic initiator, an organic silane- or latent sulfonic acid-based ionized cationic photopolymerization initiator, or a non-ionized cationic photopolymerization initiator may be used. The onium salt-based initiator may be a diaryliodonium salt, a triarylsulfonium salt, or an aryldiazonium salt, the organometallic salt-based initiator may be iron arene, the organic silane-based initiator may be o-nitrobenzyl triaryl silyl ether, triaryl silyl peroxide, or acyl silane, and the latent sulfonic acid-based initiator may be α-sulfonyloxyketone or α-hydroxymethylbenzoin sulfonate, but the present application is not limited thereto.

In one exemplary embodiment, as the cationic initiator, an ionized cationic photopolymerization initiator may be used.

In one exemplary embodiment, the encapsulation layer may further include a tackifier, which is preferably a hydrogenated cyclic olefin-based polymer. As the tackifier, for example, a hydrogenated petroleum resin obtained by hydrogenating a petroleum resin may be used. The hydrogenated petroleum resin may be partially or completely hydrogenated, or a mixture of such resins may be used. For the tackifier, one that has a high compatibility with a pressure-sensitive adhesive composition, an excellent moisture blocking property and a low content of a volatile organic component may be selected. As a specific example of the hydrogenated petroleum resin, a hydrogenated terpene-based resin, a hydrogenated ester-based resin or a hydrogenated dicyclochloropentadiene-based resin may be used. A weight average molecular weight of the tackifier may be about 200 to 5,000. The content of the tackifier may be suitably adjusted as necessary. For example, a content of the tackifier may be selected by considering a gel content which will be described below, and according to an exemplary embodiment, may be included at 5 to 100 parts by weight, 8 to 95 parts by weight, 10 to 93 parts by weight or 15 to 90 parts by weight with respect to 100 parts by weight of a solid content of the pressure-sensitive adhesive composition.

The encapsulation layer may further include a moisture absorbent when needed. The term "moisture absorbent" may refer to a material capable of removing moisture or vapor which has permeated into an encapsulation film that will be described below by a chemical reaction therewith. When the encapsulation layer includes the moisture absorbent, during the formation of a film, optical transmittance that will be described below may not be satisfied, instead, an excellent moisture blocking property may be realized. In detail, the encapsulation layer, when formed in a film, may be applied to encapsulate an OED. In this case, when the encapsulation layer may include none or a small amount of the moisture absorbent, it may be applied to encapsulate a top emission-type OED; or when the encapsulation layer may include the moisture absorbent, thereby exhibiting an excellent moisture blocking property, it may be applied to encapsulate a bottom emission-type OED, but the present application is not limited thereto.

For example, the moisture absorbent may be present in a uniformly dispersed state in the encapsulation layer or encapsulation film. Here, the uniformly dispersed state may mean a state in which the moisture absorbent is present at the same or substantially the same density in any part of the encapsulation layer or encapsulation film. As the moisture absorbent that can be used herein, for example, a metal oxide, a sulfate or an organic metal oxide may be used. In detail, as an example of the sulfate, magnesium sulfate, sodium sulfate, or nickel sulfate may be used, and as an example of the organic metal oxide, aluminum oxide octylate may be used. Here, as a specific example of the metal oxide, phosphorous pentoxide ($P_2O_5$), lithium oxide ($Li_2O$), sodium oxide ($Na_2O$), barium oxide (BaO), calcium oxide (CaO) or magnesium oxide (MgO) may be used, and an example of the metal salt, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), or a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$) may be used, but the present application is not limited thereto. As the moisture absorbent that can be included in the encapsulation layer, one or two or more of the above-described components may be used. In one exemplary embodiment, when two or more of the moisture absorbents are used, calcined dolomite may be used.

Such a moisture absorbent may be controlled in a suitable size according to its use. In one exemplary embodiment, an average particle size of the moisture absorbent may be controlled to about 10 to 15000 nm. Since a reaction speed of the moisture absorbent with moisture is not too fast, the moisture absorbent having a size in the above range can be easily stored, not damage an element to be encapsulated, and effectively remove moisture.

A content of the moisture absorbent may be suitably selected by considering a desired blocking property without particular limitation.

The encapsulation layer may also include a moisture blocker when needed. The term "moisture blocker" used herein may be a material that has no reactivity with moisture or can prevent or interfere with the movement of moisture or vapor in a film. As the moisture blocker, one or two or more of clay, talc, needle-like silica, plate-like silica, porous silica, zeolite, titania and zirconia may be used. Also, a surface of the water blocker may be treated with an organic modifier to facilitate the penetration of an organic material. Such an organic modifier may be, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium, or mixtures thereof.

A content of the moisture blocker may be suitably selected by considering a desired blocking property without particular limitation.

In addition to the above-described components, various additives may be included according to its use and a process of manufacturing an encapsulation film that will be described below. For example, the encapsulation layer may include a curable material, a crosslinking agent, or a filler in a suitable range of content according to a desired physical property.

In an exemplary embodiment, the encapsulation layer may have a single layer or two or more layers as described above. For example, the encapsulation film may include a first layer including the above-described encapsulation layer and a second layer including a pressure-sensitive adhesive resin or adhesive resin. The pressure-sensitive adhesive resin or adhesive resin included in the second layer may be the same as or different from the above-described encapsulation resin, and may be suitably selected according to the purpose of those of ordinary skill in the art. Also, each of the first and second layers may include or not include the moisture absorbent.

In an exemplary embodiment, in addition to the above-described resin, the first or second layer may include another component, for example, the above-described active energy ray polymerizable compound, a heat-curable compound, a radical initiator, a tackifier, a moisture absorbent, a moisture blocker, a dispersant or a silane compound, and the compositions of the first and second layers may be the same as or different from each other. Also, the second layer may include a curable material, a curing agent or a filler in a suitable content according to a desired physical property. Meanwhile, since the encapsulation film is applied to encapsulate an organic electronic element, a content of the moisture absorbent may be controlled by considering damage to the element. For example, a small amount or none of the moisture absorbent may be included in the layer in contact with the element. In one exemplary embodiment, the second layer in contact with the element may include 0 to 20% of the moisture absorbent with respect to the total weight of the moisture absorbent contained in the encapsulation film. Also, the first layer not in contact with the element may include 80 to 100% of the moisture absorbent with respect to the total weight of the moisture absorbent contained in the encapsulation film.

A sequence of stacking the second layer and additionally stacking the first layer is not particularly limited. For example, the second layer may be formed on the first layer, or on the contrary, the first layer may be formed on the second layer. Also, the encapsulation layer may be composed of three or more layers, and for example, two or more of the first layers may be included, or two or more of the second layers may be included.

Also, when formed to a thickness of 100 µm, the encapsulation film according to the present application may have a water vapor transmission rate (WVTR) of 50, 40, 30, 20 or 10 g/m²·day or less, which is measured in a thickness direction of the film at 100° F. and a relative humidity of 100%. As the compositions or crosslinking conditions of the metal layer and the encapsulation layer are adjusted to have such a WVTR, when the encapsulation film is applied to the encapsulation or capsulation structure of the electronic device, the encapsulation or capsulation structure may effectively block moisture or oxygen which has permeated from the outside, and thus stably protect the element. As the WVTR is lower, a more excellent moisture blocking property may be exhibited, and therefore, the lower limit may be, but is not particularly limited to, for example, 0 g/m²·day.

The encapsulation film may further include a base film or release film (hereinafter, probably referred to as a "first film"), and have a structure in which the encapsulation layer is formed on the base or release film. Also, the structure may further include a base or release film (hereinafter, also referred to as a "second film") formed on the protective layer.

A specific type of the first film capable of being used in the present application is not particularly limited. In the present application, as the first film, for example, a general polymer film used in the art may be used. In the present application, for example, as the base or release film, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-acrylic acid ethyl copolymer film, an ethylene-acrylic acid methyl copolymer film or a polyimide film may be used. Also, one or both surfaces of the base film or release film of the present application may be treated by a suitable releasing treatment. As an example of a releasing agent used for the releasing treatment of the base film, an alkyd-, silicon-, fluorine-, unsaturated ester-, polyolefin- or wax-based agent may be used, and for thermal resistance, an alkyd-, silicon- or fluorine-based releasing agent may be used, but the present application is not limited thereto.

In the present application, the thickness of the base film or release film (the first film) is not particularly limited, and may be suitably selected according to use. For example, in the present application, the thickness of the first film may be about 10 to 500 µm, and preferably about 20 to 200 µm. When the thickness is less than 10 µm, the base film may be easily deformed in the manufacturing process, and when the thickness is more than 500 µm, economic feasibility is reduced.

A thickness of the encapsulation layer included in the encapsulation film of the present application is not particularly limited, and may be suitably selected according to the following condition by considering the use of the film. A thickness of the pressure-sensitive adhesive layer may be about 5 to 200 µm, and preferably about 5 to 100 µm. When the thickness of the encapsulation layer is less than 5 µm, a sufficient adhesive property may not be ensured, and when the thickness of the encapsulation layer is more than 200 µm, it is difficult to ensure processability, the thickness is expanded due to moisture reactivity, resulting in damage to a deposition film of an organic light emitting element, and the economic feasibility is deceased.

The present application also relates to a method of manufacturing an encapsulation film. The exemplary encapsulation film may be manufactured by molding the encapsulation layer in a film or sheet form.

In an exemplary embodiment, the method may include applying a coating solution including a component constituting the above-described pressure-sensitive adhesive layer to a base or release film in a sheet or film form, and drying the applied coating solution.

The coating solution may be prepared by dissolving or dispersing the components of each encapsulation layer described above in a suitable solvent. In an exemplary embodiment, the encapsulation layer may be formed by dissolving or dispersing the moisture absorbent or filler in a solvent when needed, and mixing the moisture absorbent or filler with an encapsulation resin after grinding.

A type of the solvent used in the preparation of the coating solution is not particularly limited. However, when a drying time of the solvent is too long or drying at a high temperature is needed, problems in terms of workability or durability of the encapsulation film may occur, and therefore a solvent having a volatilization temperature of 150° C. or less may be used. In consideration of film moldability, a small amount of a solvent having the above range or more of a volatilization temperature may be mixed. As the solvent, one or two or more of methylethylketone (MEK), acetone, toluene, dimethylformamide (DMF), methylcellosolve (MCS), tetrahydrofuran (THF), xylene and N-methylpyrrolidone (NMP) may be used, but the present application is not limited thereto.

A method of applying the coating solution to the base or release film is not particularly limited, and thus may be, for example, a known coating method such as knife coating, roll coating, spray coating, gravure coating, curtain coating, comma coating or lip coating.

The applied coating solution is dried, the solvent is volatilized, and thus a pressure-sensitive adhesive layer may be formed. The drying may be performed, for example, at 70 to 150° C. for 1 to 10 minutes. The drying conditions may be changed by considering the used solvent.

A method of stacking a first layer and a second layer is not particularly limited. For example, the first layer and the second layer, which are formed on respective release films, may be laminated, thereby forming a multi-layered encapsulation film, or the second layer may be formed directly on the first layer or vice versa.

After drying, a metal layer may be formed on the encapsulation layer. A method of forming the metal layer may be a technique known in the art. For example, the metal layer may be formed of metal foil, or formed by depositing a metal on a protective layer. For example, the metal layer may be formed by electrolysis or rolling.

The present application also relates to an OED. The OED, as shown in FIG. 2, may include a substrate 21; an organic electronic element 22 formed on the substrate 21; and the above-described encapsulation film 10 for encapsulating the organic electronic element 22. The encapsulation film may encapsulate entire surfaces, for example, top and side surfaces of the organic electronic element. The encapsulation film may include an encapsulation layer containing a pressure-sensitive adhesive composition or adhesive composition in a crosslinked state. Also, the OED may be formed such that the encapsulation layer is in contact with the top surface of the organic electronic element.

Here, the organic electronic element may be, for example, an organic light emitting element.

Also, the present application relates to a method of manufacturing an OED. The OED may be manufactured using, for example, the encapsulation film.

The encapsulation layer may be formed as a structure exhibiting an excellent moisture blocking property in the OED, and effectively fixing and supporting the substrate and the metal layer.

Also, the encapsulation layer may be formed to be a stable encapsulation layer whether or not the OED is a top emission or bottom emission type.

The term "encapsulation layer" used herein may be a pressure-sensitive adhesive covering all of the top and side surfaces of the organic electronic element.

To manufacture the OED, for example, applying the above-described encapsulation film to the substrate on which the organic electronic element is formed to cover the entire surfaces of the organic electronic element; and curing the encapsulation film may be included. The curing of the encapsulation film means curing of the encapsulation layer.

The term "curing" used herein may refer to the preparation of a pressure-sensitive adhesive by crosslinking the pressure-sensitive adhesive composition of the present application through heating or UV irradiation. Also, the curing may mean that the adhesive composition is prepared in an adhesive type.

In detail, the organic electronic element may be formed by forming a transparent electrode on a glass or polymer film used as a substrate through vacuum deposition or sputtering, forming a light emitting organic material layer, for example, consisting of a hole transport layer, an emitting layer and an electron transport layer on the transparent electrode, and further forming an electrode layer thereon. Subsequently, the encapsulation film may be disposed so that the encapsulation layer covers the entire surfaces of the organic electronic element of the substrate undergoing the above-described process.

Effect

An encapsulation film of the present application may be applied to encapsulate or capsulate an OED such as an OLED. The film can also be formed to have a structure for effectively blocking moisture or oxygen entering the OED from the outside, and has excellent mechanical properties such as handleability and processability.

EXPLANATION OF REFERENCE NUMERALS

Figure 1:
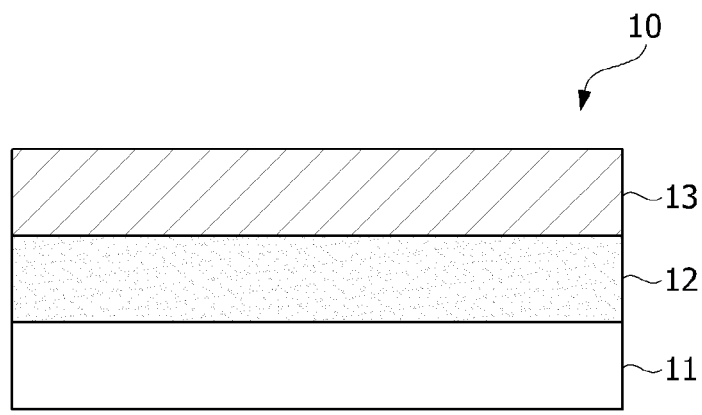
FIG. 1 is a cross-sectional view of an encapsulation film according to an exemplary embodiment of the present application.
Figure 2:
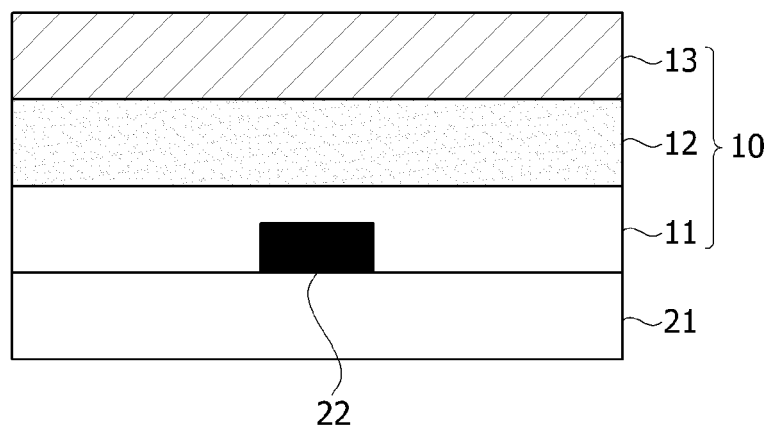
FIG. 2 is a cross-sectional view of an OED according to an exemplary embodiment of the present application.

10: encapsulation film
11: encapsulation layer
12: metal layer
13: protective layer
21: substrate
22: organic electronic element

DETAILED DESCRIPTION OF EXEMPLARY EMBODIMENTS

Hereinafter, the present application will be described in further detail with reference to examples according to the present application and comparative examples not according to the present application, and the scope of the present application is not limited to the following examples.

Example 1

Preparation of Solution for Encapsulation Layer

A coating solution was prepared by adding 50 g of butyl rubber (Br068, EXXON) as an encapsulation resin, 24 g of a hydrogenated hydrocarbon resin (Eastotac H-100L) as a tackifier, 15 g of 2-(2-ethoxyethoxy)ethyl acrylate as a monofunctional acrylate, 10 g of trimethylolpropane triacrylate as a multifunctional active energy ray polymerizable compound and 1 g of 2,2-dimethoxy-1,2-diphenylethane-1-one (Irgacure 651, Ciba) as a radical initiator, and diluting the resultant mixture with toluene to a solid content of about 15 wt %.

Preparation of Protective Layer and Metal Layer

A coating solution for a protective layer was prepared by mixing Sylgard 184 (polydimethylsiloxane) manufactured by Dow Corning in a weight ratio of a main material to a curing agent of 5:1, and the coating solution was applied to a 50-μm aluminum film in a thickness of 100 μm.

Manufacture of Encapsulation Film

An encapsulation film was manufactured by forming an encapsulation layer having a thickness of 50 μm by coating a release surface of a release PET with the prepared solution for the encapsulation layer and drying the coated surface in an oven at 100° C. for 15 minutes, and laminating the encapsulation layer with the aluminum film. Physical properties of the film sample irradiated with UV rays at 2 J/cm$^2$ were measured.

Example 2

An encapsulation film was formed by the same method as described in Example 1, except that a metal layer was formed to a thickness of 30 μm.

Example 3

An encapsulation film was formed by the same method as described in Example 1, except that a metal layer was formed to a thickness of 20 μm.

Example 4

An encapsulation film was formed by the same method as described in Example 1, except that a protective layer was formed to a thickness of 50 μm.

Comparative Example 1

An encapsulation film was formed by the same method as described in Example 1, except that a metal layer (SUS304) having a thickness of 700 μm was used and a protective layer was not used.

Comparative Example 2

An encapsulation film was formed by the same method as described in Example 1, except that polyethylene terephthalate was used as a protective layer.

Experimental Example 1—Warpage of Panel

Each of the encapsulation films manufactured in the examples and the comparative examples was disposed on a substrate, stored in an oven at 100° C. for 1 hour and then the warpage of the film was measured at room temperature. In detail, a distance (a degree of lifting of the side surface of the film) between a side surface of the film which had warpage and a bottom surface was measured.

Experimental Example 2—Tensile Modulus

Tensile moduli of the protective layer, the metal layer and the encapsulation layer prepared in each of the examples and the comparative examples were measured. A specimen was prepared by being cut in a size of 50 mm×10 mm (length× width) in a lengthwise direction, which was the coating direction during the formation of the protective layer, the metal layer and the encapsulation layer, and both ends of the specimen were taped in a lengthwise direction until only 25 mm of the specimen remained. Subsequently, the specimen was stretched by grabbing the taped parts at 25° C. and a tensile speed of 1 mm/min to measure a tensile modulus.

TABLE 1

|  | Tensile modulus (MPa) | | | Warpage (mm) |
| --- | --- | --- | --- | --- |
|  | Protective layer | Metal layer | Encapsulation layer |  |
| Example 1 | 2 | 69,000 | 5 | 4 |
| Example 2 | 2 | 69,000 | 5 | 2.7 |
| Example 3 | 2 | 69,000 | 5 | 1.9 |
| Example 4 | 2 | 69,000 | 5 | 1.9 |
| Comparative Example 1 | — | 203,000 | 5 | 4.8 |
| Comparative Example 2 | 2350 | 69,000 | 5 | 5 |

In Comparative Example 2, PET was used as a protective layer, and even though PET had a coefficient of linear expansion of about 59.4 ppm/K(polydimethylsiloxane: about 310 ppm/K), the tensile modulus was out of the above range, resulting in considerable warpage of the film.

What is claimed is:

1. An encapsulation film for an organic electronic element, comprising:
    a protective layer having a tensile modulus of 0.01 to 500 MPa at 25° C.;
    a metal layer formed on one surface of the protective layer; and
    an encapsulation layer formed on the metal layer,
    wherein the protective layer has a thickness of 40 to 400 μm,
    wherein the metal layer has a thickness of 10 to 100 μm, and
    wherein the protective layer and the metal layer satisfy General Equation 1:

$T_p/T_m \geq 1$     [General Equation 1]

where $T_p$ is a thickness of the protective layer, and $T_m$ is a thickness of the metal layer.

2. The film of claim 1, wherein the metal layer has a tensile modulus of 10,000 to 250,000 MPa at 25° C.

3. The film of claim 1, wherein the metal layer comprises any one of a metal, a metal oxide, a metal nitride, a metal carbide, a metal oxynitride, a metal oxyboride, and mixtures thereof.

4. The film of claim 1, wherein the metal layer comprises any one of aluminum, copper, nickel, silicon oxide, aluminum oxide, titanium oxide, indium oxide, tin oxide, indium tin oxide, tantalum oxide, zirconium oxide, niobium oxide, and mixtures thereof.

5. The film of claim 1, wherein the protective layer comprises one or more resin components selected from the group consisting of polyorganosiloxane, a polyimide, a styrene-based resin or elastomer thereof, a polyolefin-based resin or elastomer thereof, a polyoxyalkylene-based resin or elastomer thereof, a polyester-based resin or elastomer thereof, a polyvinylchloride-based resin or elastomer thereof, a polycarbonate-based resin or elastomer thereof, a polyphenylenesulfide-based resin or elastomer thereof, a polyamide-based resin or elastomer thereof, or elastomer thereof, an epoxy-based resin or elastomer thereof, a silicone-based resin or elastomer thereof, and a fluorine-based resin or elastomer thereof.

6. The film of claim 1, wherein the encapsulation layer is formed with a single layer or two or more layers.

7. The film of claim 1, wherein the encapsulation layer comprises an encapsulation resin.

8. The film of claim 7, wherein the encapsulation layer further comprises an active energy ray polymerizable compound.

9. The film of claim 1, wherein the encapsulation layer comprises a moisture absorbent.

10. An organic electronic device, comprising:
    a substrate;
    an organic electronic element formed on the substrate; and
    the encapsulation film of claim 1, which encapsulates the organic electronic element.

11. The device of claim 10, wherein the encapsulation layer of the encapsulation film covers the entire surfaces of the organic electronic element.

12. A method of manufacturing an organic electronic device, comprising:
    applying the encapsulation film of claim 1 to a surface on which an organic electronic element is formed to cover entire surfaces of the organic electronic element; and
    curing the encapsulation film.

* * * * *